United States Patent
Wright, Jr. et al.

(10) Patent No.: US 12,252,787 B2
(45) Date of Patent: *Mar. 18, 2025

(54) METHODS FOR DEPOSITING TUNGSTEN OR MOLYBDENUM FILMS

(71) Applicant: ENTEGRIS, INC., Billerica, MA (US)

(72) Inventors: Robert Wright, Jr., Newtown, CT (US); Thomas H. Baum, New Fairfield, CT (US); Bryan C. Hendrix, Danbury, CT (US); Shawn D. Nguyen, Danbury, CT (US); Han Wang, Hillsboro, OR (US); Philip S. H. Chen, Bethel, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/229,077

(22) Filed: Aug. 1, 2023

(65) Prior Publication Data

US 2024/0035157 A1    Feb. 1, 2024

Related U.S. Application Data

(63) Continuation of application No. 16/577,860, filed on Sep. 20, 2019, now Pat. No. 11,761,081.

(60) Provisional application No. 62/743,582, filed on Oct. 10, 2018.

(51) Int. Cl.
| | | |
|---|---|---|
| C23C 16/455 | (2006.01) | |
| C23C 16/18 | (2006.01) | |
| C23C 16/56 | (2006.01) | |
| H01L 21/02 | (2006.01) | |

(52) U.S. Cl.
CPC ........ *C23C 16/45534* (2013.01); *C23C 16/18* (2013.01); *C23C 16/56* (2013.01); *H01L 21/0228* (2013.01)

(58) Field of Classification Search
None
See application file for complete search history.

(56) References Cited

U.S. PATENT DOCUMENTS

| | | |
|---|---|---|
| 3,305,386 A | 2/1967 | Hafner et al. |
| 4,741,928 A | 5/1988 | Wilson et al. |
| 6,281,123 B1 | 8/2001 | Sandhu |
| 6,284,655 B1 * | 9/2001 | Marsh ............... H01L 21/76849 438/650 |
| 2005/0069632 A1 * | 3/2005 | Yamasaki ......... C23C 16/45523 257/E21.585 |
| 2008/0038932 A1 | 2/2008 | Wagner |
| 2008/0119033 A1 | 5/2008 | Ashigaki et al. |
| 2008/0317972 A1 | 12/2008 | Hendriks et al. |

(Continued)

FOREIGN PATENT DOCUMENTS

| | | |
|---|---|---|
| EP | 0540983 A2 | 5/1993 |
| JP | 2003179159 A | 6/2003 |

(Continued)

*Primary Examiner* — Jose I Hernandez-Kenney

(57) ABSTRACT

Described are vapor deposition methods for depositing metal films or layers onto a substrate, wherein the metal is molybdenum or tungsten; the methods involve organometallic precursor compounds that contain the metal and one or more carbon-containing ligands, and include depositing a metal layer formed from the metal of the precursor, onto a substrate, followed by introducing oxidizer to the formed metal layer.

3 Claims, 2 Drawing Sheets

(56) References Cited

U.S. PATENT DOCUMENTS

| | | |
|---|---|---|
| 2009/0159871 A1 | 6/2009 | Lee et al. |
| 2009/0202742 A1 | 8/2009 | Meiere |
| 2009/0291549 A1* | 11/2009 | Yamasaki ................ C23C 8/36 257/E21.328 |
| 2011/0312148 A1 | 12/2011 | Kim et al. |
| 2016/0196980 A1 | 7/2016 | Degai |
| 2019/0226086 A1* | 7/2019 | Wright, Jr. ............. C23C 16/18 |

FOREIGN PATENT DOCUMENTS

| | | |
|---|---|---|
| JP | 2009114508 A | 5/2009 |
| JP | 2010168255 A | 8/2010 |
| KR | 20060011396 A | 2/2006 |
| WO | 2017007893 A1 | 1/2017 |
| WO | 2017143246 A1 | 8/2017 |

* cited by examiner

METHODS FOR DEPOSITING TUNGSTEN OR MOLYBDENUM FILMS

CROSS REFERENCE TO RELATED APPLICATIONS

This application is a continuation of U.S. patent application Ser. No. 16/577,860 filed Sep. 20, 2019, which claims the benefit of U.S. Provisional Patent Application No. 62/743,582 filed Oct. 10, 2018, the disclosures of each of which are hereby incorporated herein by reference in their entirety.

FIELD

The present disclosure relates to vapor deposition methods for depositing a metal film, metal layer, or other metal structure, onto a substrate, wherein the metal is molybdenum or tungsten. The methods involve metal precursor compounds (or "complexes") that contain the metal and one or more carbon-containing ligands, and include depositing a metal layer formed from the metal of the precursor, onto the substrate, followed by introducing oxidizer to the formed metal layer with heating.

BACKGROUND

Molybdenum and tungsten, especially in purified forms, are low-resistivity refractory metals that are used in microelectronic devices such as memory, logic chips, and other devices that contain polysilicon-metal gate electrode structures. Various vapor deposition techniques, with a range of raw material inputs, have been used to deposit thin metal layers of molybdenum or tungsten for these applications. By vapor deposition techniques, a "precursor" compound that contains the metal is processed inside of a deposition chamber that contains a substrate, with process materials and conditions being sufficient to cause metal from the precursor to be deposited as a metal layer on the substrate.

Vapor deposition techniques include chemical vapor deposition (CVD) and atomic layer deposition (ALD) techniques, which include a number of derivative versions of either of these, such as UV laser photo-dissociation CVD, plasma-assisted CVD, and plasma-assisted ALD, among others. For depositing metals of high purity, on two or three-dimensional microelectronic device substrates, CVD and ALD processes can be desirable because they can give high levels of purity, often with good conformal step coverage on highly non-planar microelectronic device geometries. But the cost and complexity of plasma assisted deposition and high temperature deposition systems can increase production costs and tool costs. Processes such as these that require certain higher temperatures can also cause damage to previously-deposited or underlying structures, especially structures of logic devices, which are known to be temperature sensitive.

In a typical CVD process, a vaporized (gaseous) precursor is contacted with a substrate (e.g., a wafer), which may be optionally heated, in a low pressure or ambient pressure deposition chamber. The precursor introduced to the substrate is decomposed, leaving a metal-containing deposit on the substrate surface to form a thin layer (or "film") of highly pure deposited metal. Volatile by-products are removed by gas flow through the deposition chamber.

In addition to the gaseous precursor, vapor deposition processes may often involve supplying one or more additional gases (sometimes referred to as "reactant gases" or "co-reactants") to the deposition chamber. The reactant gas may function to allow the deposition process to take place more efficiently or with improved deposition results. Some reactant gases react with a precursor to release the metal of the precursor molecule, to become deposited onto the substrate as the elemental metal. Other reactant gases can perform various different functions, such as to improve the performance or useful lifetime of a deposition chamber or deposition chamber component.

As for the precursor, tungsten and molybdenum films have been formed by vapor deposition methods by use of some well-known fluorine-containing precursors such as tungsten fluorides (e.g., tungsten hexafluoride, tungsten pentafluoride). But the use of fluorine-containing precursors can be disfavored due to the presence of fluorine, causing device performance issues and the need for "special" handling precautions. Non-fluorinated precursor alternatives have been developed, such as chlorine-containing precursors, e.g.: molybdenum pentachloride, molybdenum oxychlorides such as $MoO_2Cl_2$, and $MoOCl_4$, tungsten pentachloride, tungsten hexachloride. A difficulty with using these chlorine-containing precursors for vapor deposition methods typically involve heating a substrate to a temperature of at least about 400° C., such as up to 800° C. These high temperatures require complex processing equipment and consume thermal budget for temperature-sensitive devices, meaning that temperature-sensitive substrates such as logic devices can be damaged. Precursors that can allow for a metal layer to be deposited at lower temperature would be preferred by allowing for lower operating temperatures and the use of less expensive and less complex equipment, and would be especially beneficial for fabricating temperature-sensitive devices such as logic devices.

Other non-fluorinated precursors include carbonyl-containing precursors such as molybdenum hexacarbonyl ($Mo(CO)_6$) and tungsten hexacarbonyl ($W(CO)_6$), and imide-amide precursors. These can be deposited at temperatures that are lower than those required for chloride and oxychloride precursors. But the deposited metal structures can suffer from high resistivity because carbon, oxygen, or nitrogen from the precursor can become incorporated into the deposited metal as contaminants. Also, step coverage can lack sufficient quality for commercial applications.

Based on these considerations, there is a need to make molybdenum and tungsten metal films and coatings on a variety of substrates, such as logic devices at lower deposition temperatures, while achieving very high purity of the deposited metal layer from various organometallic precursors.

SUMMARY

In the microelectronic fabrication arts, comparatively lower-temperature (<400° C.) vapor deposition processes for depositing layers of molybdenum or tungsten are required when depositing the metal layer onto heat-sensitive device. The lower temperature deposition methods allow process compatibility with existing logic device structures on a partially fabricated device substrate. Especially needed is a comparably low temperature process for depositing molybdenum or tungsten onto a microelectronic device substrate, e.g., a logic device, to produce a metal layer having a purity level that results in a very low electrical resistance as well as conformality/fill features as required for preparing these devices.

According to Applicant's invention, vapor deposition methods can be used for depositing a highly pure layer of molybdenum or tungsten metal onto a substrate by the use of a gaseous precursor that contains molybdenum or tungsten and one or more carbon-containing ligands. These vapor deposition methods can be performed at comparatively low temperatures, meaning, for example, temperatures that are lower than deposition temperatures required for vapor deposition methods that use a halogenated (e.g., fluorinated, chlorinated, brominated, iodinated) or oxy-halogenated precursor. Vapor deposition methods of the present description include flowing a gaseous organometallic precursor into a deposition chamber that contains the substrate for deposition, with optional co-reactant. The conditions of the deposition chamber (e.g., elevated temperature), and the flow and pressure of the precursor and optional co-reactant, combine to cause tungsten or molybdenum metal from the precursor to become deposited onto a surface of the substrate as a substantially pure deposited metal film.

A vapor deposition step may be performed in any suitable manner as variously described herein, by an atomic layer deposition method, by a chemical vapor deposition method, or by a modified version or derivative version of these methods. The method is performed using process parameters and conditions that include a pulsed flow of oxidizer, which reacts with carbon in the deposition system, e.g., at a surface of a deposited metal layer, to oxidize the carbon and remove the carbon from the deposited metal layer or prevent deposition of the carbon at the metal layer. The resulting metal layer is highly pure, including a low concentration of carbon, preferably a concentration of carbon that is lower than a concentration of carbon that would be contained in a metal layer prepared by a similar vapor deposition method that does not include presenting oxidizer to the deposition chamber as described herein.

The molybdenum or tungsten layer can be deposited onto any desired substrate and any specific material of a substrate, with example substrates being microelectronic device substrates that are "in-process," meaning in the process of being fabricated yet incomplete. The microelectronic device may be one that provides memory function or one that provides logic function. Examples of functions of deposited molybdenum or tungsten include: as a conductive layer (e.g., as a an interconnect, a contact, or an electrode) of a microelectronic logic device. The deposited molybdenum may have a thickness that is effective to perform a desired function, and can be continuous. The method is particularly suited for depositing a metal layer onto a substrate that includes a logic function, which substrates are known to be temperature sensitive. Vapor deposition methods as described herein can be performed at comparably low temperatures that do not harm these temperature-sensitive substrates.

An aspect of the invention is a vapor deposition method for forming a metal film on a substrate. The method includes: flowing gaseous precursor into a deposition chamber and exposing the gaseous precursor to a substrate to deposit the metal onto the substrate to form a deposited metal layer. The precursor includes a metal and one or more carbon-containing ligands, wherein the metal is molybdenum or tungsten. The method also includes flowing oxidizer into the deposition chamber to expose the deposited metal layer to the oxidizer.

DETAILED DESCRIPTION

Figure 1:
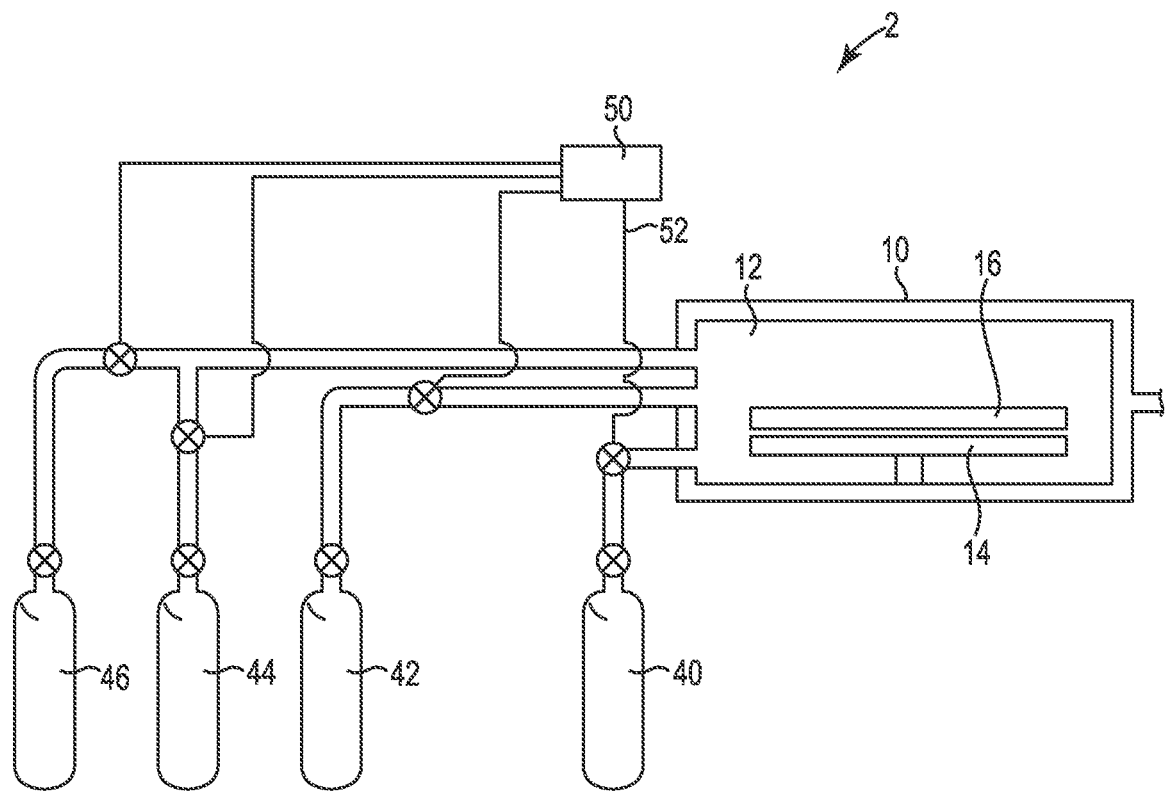
FIG. 1 illustrates an example of a system useful for a vapor deposition method as described.

The following description relates to vapor deposition methods useful for depositing a highly pure layer of molybdenum or tungsten metal onto a substrate by the use of a gaseous precursor that contains molybdenum or tungsten and one or more carbon-containing ligands, using comparatively low temperatures. The vapor deposition methods include flowing the gaseous metal-containing precursor to an interior of a deposition chamber that contains the substrate for deposition, with optional co-reactant. The conditions of the deposition chamber (e.g., elevated temperature), and the flow and pressure of the precursor and optional co-reactant, combine to cause tungsten or molybdenum metal from the precursor to become deposited onto a surface of the substrate as a substantially pure deposited metal film.

As a challenge to vapor deposition methods that use these types of precursors, the conditions of the deposition chamber can also allow for or result in small amounts of carbon derived from the precursor ligand to become deposited as a contaminant in the metal layer. When the precursor contains a carbon-containing ligand such as a carbonyl group, an alkyl amide group, an alkyl amine group, an alkyl or aryl group (which may be substituted), or a cyclopentadienyl group, the carbon from the ligand can be released in the deposition chamber during the deposition process. At temperatures commonly used for vapor deposition methods using these types of precursors, which can be lower than temperatures used to deposit metal layers on a substrate from various other types of precursors such as halogenated precursors (i.e., fluorinated or chlorinated precursors) it is possible for the precursor carbon to become deposited along with the metal as part of a deposited metal film, such as in the form of a metal carbide, e.g., molybdenum carbide ($Mo_2C$) or tungsten carbide (WC). Any such carbon that becomes included in the metal layer is an unwanted contaminant because the carbon can detrimentally affect the performance of the metal film in a microelectronic device. The carbon may, for example, undesirably increase resistivity of the film, modify the morphology or identity of the film, or both.

According to the invention, the Applicant has determined that oxidizer (e.g., gaseous oxygen ($O_2$), ozone ($O_3$), or a combination of water ($H_2O$) and hydrogen ($H_2$)) can be introduced into a deposition chamber during this type of deposition method, e.g., to improve the composition of the deposited metal layer. The oxidizer is introduced in an amount and manner to cause the oxidizer to reduce the amount of carbon that becomes deposited in the completed metal layer; e.g., the oxidizer can react with carbon at a surface of the metal layer during a deposition process and the carbon is removed from the metal layer.

The presently-described method of depositing a metal layer onto a substrate using an organometallic precursor can be any type of vapor deposition method, including those methods commonly referred to as atomic layer deposition, those methods commonly referred to as chemical vapor deposition, or modifications of either of these methods.

Chemical vapor deposition (CVD) and atomic layer deposition (ALD) are chemical processes by which a chemical precursor, optionally and typically in combination with one or more other materials such as a co-reactant, is introduced to a substrate within a deposition chamber with the result of forming a thin "layer" or "film" of a material derived from the precursor onto a surface of the substrate. In a chemical vapor deposition step, a thickness of a deposited material can be controlled by deposition parameters such as the length of time during which the substrate is exposed to the precursor. In an atomic layer deposition step, thickness of a deposited layer can be "self-limiting" based on process conditions such as selected deposition temperature and pressure.

According to the present description, a gaseous organometallic precursor that contains molybdenum or tungsten as the metal, along with one or more optional co-reactant gases, are introduced to a deposition chamber (a.k.a., "reaction chamber") that contains a substrate. The gaseous metal precursor is a chemical compound that contains an atom of the metal chemically associated with one or more carbon-containing chemical groups (i.e., "ligands") attached to the metal atom. The pressure and flow rate of the precursor and the optional co-reactant gas flow, and the deposition chamber conditions (e.g., temperature, pressure, temperature of the substrate, among other conditions), are selected to cause the metal atom of the precursor to be released from the ligands of the precursor within the deposition chamber, and for the metal to become deposited onto a surface of the substrate. Volatile by-products of the deposition process can be removed by gas flow through the deposition chamber.

If necessary or desired, the gaseous organometallic precursor can be carried to the deposition chamber using a carrier gas, which may be an inert gas such as helium, argon, nitrogen, or a combination thereof. The carrier gas can be combined with the gaseous organometallic precursor to allow the carrier gas to carry a desired concentration, and a desired total amount, of the gaseous precursor to the reaction chamber, which contains the substrate. The concentration of the gaseous precursor in the carrier gas, and the flow rate of the gaseous carrier gas-precursor mixture to the deposition chamber, can be as desired and as effective to produce a desired deposited metal layer during a particular deposition process, with particular values for these parameters being selected in combination with other parameters of a deposition process such as the size (volume) of the deposition chamber, flow rate of a co-reactant gas, substrate temperature, deposition chamber pressure, among others.

Also if necessary or desired, a co-reactant such as a reducing gas (referred to herein as a "co-reactant gas"), e.g., hydrogen ($H_2$), is typically introduced into the deposition chamber to facilitate deposition of the elemental metal from the precursor onto the substrate surface. The relative amount (e.g., relative flow rate, pressure, etc.) of the co-reactant gas introduced to the deposition chamber can be as desired and as effective to produce a desired deposited metal layer in a particular process, with particular values for these parameters being selected in combination with other parameters of a deposition process such as a flow rate of precursor, substrate temperature, and chamber pressure. Further, according to vapor deposition methods as described, various other steps can be performed, and parameters controlled, such as heating the substrate, selectively purging the deposition chamber by introducing a gaseous atmosphere or by way of a vacuum step, etc., in addition to other optional or desired steps.

The precursor used in the vapor deposition step is an organometallic precursor containing tungsten or molybdenum, and one or more organic ligands chemically bonded to the metal center. The organic ligand contains carbon and may contain hydrogen and oxygen, and may be in the form of one or a chain of carbon atoms having oxygen or hydrogen atoms bonded thereto, as well as one or more functional groups (e.g., amino, carbonyl, etc.) bonded to a carbon. The ligand may be or may include, e.g., an alkyl group, a substituted alkyl group, a cyclic or aromatic group which may be optionally substituted, a carbonyl group (—C(O)), an alkyl amide group, an alkyl imide group, or a combination of these. Examples of these types of gaseous metal precursors (sometimes referred to as "organometallic" precursors) are known in the vapor deposition arts and include compounds known as organometallic carbonyl precursors, and organometallic amide-imide precursors. Specific examples include bis(ethylbenzene) molybdenum, bis(ethylbenzene) tungsten, molybdenum hexacarbonyl ($Mo(CO)_6$), tungsten hexacarbonyl ($W(CO)_6$), and cyclopentadienyl (Cp) complexes, alkyl cyclopentadienyl and hydride complexes of molybdenum and tungsten.

One feature of a vapor deposition process of the present description is a deposition temperature that is relatively lower than deposition temperatures that are required for depositing a metal layer from certain other types of precursors. A deposition temperature for a vapor deposition process as described, using an organometallic precursor that contains carbon-containing ligand, is relatively lower as compared to a temperature required for deposition using a halogenated (fluorinated, chlorinated, brominated, iodinated) or oxy-halogenated precursor. Vapor deposition of a metal layer using various organometallic precursors as described can be accomplished at temperatures that are below about 400 degrees Celsius, for example below about 300 degrees Celsius. Advantageously, these lower temperatures allow the presently-described methods to be used on heat-sensitive substrates such as microelectronic devices designed for performing logic functions, e.g. microprocessors. However, another feature of these relatively-low temperature vapor deposition steps, using an organometallic precursor, can be the presence of carbon as a contaminant in the layer of deposited metal.

To remove the carbon, an oxidizer is introduced into the deposition chamber in a manner that causes the oxidizer to react with the carbon that is present in the deposited thin-film of metal. The oxidizer, by reacting with the carbon, inhibits or prevents the carbon from being deposited onto the metal layer, or removes carbon from the deposited metal layer, during deposition. The oxidizer can be any gaseous chemical material that will react with carbon present in deposited film, e.g., present in the metal layer, to form a volatile compound that separates from the metal layer and inhibits or prevents incorporation of the carbon into the metal layer.

Examples of useful oxidizer include gaseous oxygen ($O_2$), ozone ($O_3$) and a combination of water vapor and gaseous hydrogen. The oxidizer, e.g., gaseous oxygen, can react with carbon present in the deposited film, e.g., as a contaminant in the metal layer, and produce carbon dioxide, which either does not become incorporated into the metal layer or which becomes separated from the metal layer, during the deposition step. The oxidizer can be introduced into the deposition chamber in an amount, manner, flow, time, and pressure that will be effective to cause the oxidizer to react with the carbon during deposition of a metal layer. In preferred methods, the metal film prepared by using oxygen during deposition can contain a reduced amount of carbon as compared to an amount of carbon that is present in a comparable metal film prepared by the same method and from the same materials, but that does not include introducing the oxidizer into the deposition chamber. In a preferred method, the metal film prepared by using oxygen during deposition can have a resistivity that is lower when compared to a resistivity of a comparable metal film prepared by the same method and from the same materials, but that does not include introducing the oxidizer into the deposition chamber and process. In certain presently-preferred example methods, the oxidizer is effective to remove carbon from a deposited metal layer, or to prevent the incorporation of carbon into the metal layer, when the oxidizer is introduced into the deposition process in an "interrupted" or "pulsed" manner, meaning that the flow of the gaseous oxidizer is not steady and the time of the pulse introduction can be controlled.

Deposition of elemental molybdenum or tungsten using a gaseous organometallic precursor (including molybdenum or tungsten and one or more carbon-containing ligands) as described can be performed using available vapor deposition equipment and generally understood techniques adapted for use to deposit a layer of elemental molybdenum or tungsten from the precursor, additionally with the introduction of oxygen into the deposition chamber to remove carbon from the deposited metal layer.

As an example of a useful system for a method of the present description, FIG. 1 schematically (and not to scale) shows a system that can be useful for carrying out a vapor deposition process as described, which may be chemical vapor deposition, atomic layer deposition, or a modified version or a derivative of either of these methods. FIG. 1 shows vapor deposition system 2, including deposition chamber 10 having interior 12 which contains platen 14, which supports substrate 16. Interior 12 as illustrated is sized to accommodate only a single substrate 16, but may instead be of any size desired for containing multiple substrates for vapor deposition processing.

Still referring to FIG. 1, cylinders 40, 42, 44, and 46 are connected to interior 12 to allow for gaseous fluid to selectively flow from each cylinder into interior 12. Each of the cylinders can contain a liquid or gaseous raw material to be supplied to interior 12, in gaseous form, for use in a vapor deposition step. For example, cylinder 46 can contain a liquid, solid, or gaseous organometallic precursor. Cylinder 44 can contain inert gas for use as a carrier gas to carry a concentration of the organometallic precursor to interior 12. In use, carrier gas from carrier gas-containing cylinder 44 can flow through the conduit that can also be connected through open valves to cylinder 46, which contains the precursor. The combination of the carrier gas and precursor can be controlled to flow into interior 12.

Cylinder 42, which is optional, can contain a co-reactant such as hydrogen gas, another reducing gas, or a different co-reactant. One or more additional optional cylinders (not shown) may also be present to contain and supply any of other various useful or co-reactants or other gaseous fluid such as another inert gas (e.g., for a purge step) to interior 12.

Cylinder 40 contains an oxidizer such as oxygen (02).

Though not specifically shown, any of a variety of known measurement or flow control devices can also be present in system 2 to monitor and adjust the amounts and relative amounts of flow of each gaseous fluid from the cylinders, as well as conditions such as temperature or pressure of a gaseous flow, a temperature of interior 12, or a temperature of platen 14 or substrate 16; these may include pressure regulators, flow regulators (e.g., mass flow regulators), sensors (pressure sensors, temperature sensors), and the like. Control system 50 (which may be or may include a computer, central processing unit (CPU), programmable logic controller (PLC), or the like, includes wiring 52 or other (e.g., wireless) communication devices to electronically connect control system 50 to select valves, sensors, or other flow control devices of vapor deposition system 2. Control system 50, by controlling the valves and optionally other flow control mechanisms, and by monitoring pressure and temperature sensors, is effective to control a flow of each of the fluids of the cylinders to provide a desired combination of flows of gaseous fluids from the cylinders into interior 12.

In a system such as that of FIG. 1, or an alternate system that is also effective for vapor deposition of molybdenum or tungsten as described, deposition processing parameters can be controlled to perform vapor deposition as presently described, including to: deposit a substantially pure metal layer onto a surface of a substrate with the metal layer containing carbon as a contaminant; and dispensing oxidizer to the interior to oxidize the carbon contaminant and remove the carbon from the deposition chamber or from the metal layer if already deposited. With the carbon removed, the deposited metal layer will have a higher purity and improved properties of a deposited metal layer of a microelectronic device, such as improved (reduced) resistivity, relative to a comparable deposited metal layer prepared by a similar deposition method (using the same materials and conditions) that does not have the carbon removed by exposure to and reaction with the oxidizer as described herein.

A method of depositing elemental tungsten or molybdenum on a substrate surface, as a substantially pure metal layer, can be performed by a deposition step or series of deposition steps that provide a substantially pure metal layer having a desired level of purity (especially with respect to a relatively low level of carbon contaminant). Various options are available with respect to how the gaseous organometallic precursor is supplied to an interior of a deposition chamber, and how the metal of the precursor becomes deposited onto the substrate. Variables (parameters) of the vapor deposition process include: the pressure and rate of flow of gaseous organometallic precursor; the relative amount of gaseous precursor to inert carrier gas (if used) the presence and type of any co-reactant such as a reducing gas; the relative amount of gaseous precursor to a co-reactant; the use of an inert gas purge during the method; and whether the flow of gaseous precursor, a co-reactant, oxidizing agent, or an inert purge gas, is continuous (i.e., steady or uniform) or pulsed (e.g., interrupted).

A flow of a gaseous material such as an organometallic precursor (e.g., as part of a carrier gas-precursor mixture), a co-reactant, oxidizer, etc., may be continuous (i.e., steady or uniform) or pulsed (e.g., "interrupted" or "non-uniform"), as desired and for various reasons. If pulsed, the flow of the gaseous fluid is not continuous, but is intermittently (e.g., periodically) caused to flow into the deposition chamber, and then not to flow into the deposition chamber, in cycles that include an on-flow period and an off-flow period, over the course of a deposition process. During the same deposition process, other gaseous materials (e.g., precursor, co-reactant, inert purge gas, etc.) can be supplied to the deposition chamber either in a continuous or pulsed manner. A purge or vacuum period may be used in the process, as desired. One reason for employing the pulsed process is to improve the conformality or step-coverage of the deposited film over non-planar structures.

In certain embodiments of the described methods, the flow of gaseous organometallic precursor (e.g., as part of a carrier gas-precursor mixture) can be steady, the flow of one or more co-reactants can be steady, and the flow of oxidizer can be pulsed, i.e., interrupted, with an on-flow period of the oxidizer and an off-flow period of the oxidizer making up one pulse "cycle" of the oxidizer. See FIG. 2. The flow of the oxidizer is not continuous, but is intermittently pulsed on (e.g., periodically) to the deposition chamber (during an "on-flow period"), and then pulsed off to the deposition chamber (during an "off-flow period"), in cycles, over the course of the entire film deposition step.

According to other exemplary methods sometimes referred to as "sequential" vapor deposition methods, multiple different gaseous fluids (e.g., a precursor, oxidizer, co-reactant, and inert purge gas) may be supplied to a deposition chamber during a deposition method in an alternating and sequential pulsed fashion, e.g.: a first period of precursor flow is turned on while flows of co-reactant gas and oxidizer are turned off; followed by a second period of co-reactant flow being turned on with precursor and oxidizer flow being turned off; followed by a third period of precursor and co-reactant flows being turned off while flow of oxidizer is turned on; none of the flows of precursor, oxidizer, or co-reactant is continuous, and each flow is interrupted or "pulsed." In another example: in a first period precursor flow and co-reactant are both turned on while oxidizer flow is turned off; followed by a period oxidizer flow being turned on; followed by another period like the first, with precursor flow and co-reactant both turned on while oxidizer flow is turned off; an inert purge gas may be flowed through the deposition chamber after the first flow of precursor and co-reactant and before the flow of oxidizer, and then again after the flow of oxidizer and before the subsequent flow of precursor and co-reactant.

Each on-flow period and each off-flow period for any pulsed flow of gaseous fluid may be the same or different relative to those of another gaseous fluid. And the period of on-flow for a particular gaseous fluid may be the same or may be different from the period of off-flow. One or more purge or vacuum periods may be included in the method, as desired, e.g., between any of the on-flow or off-flow periods.

According to certain examples of the present method, a metal layer is deposited onto a substrate, and carbon is removed from a deposited metal layer or inhibited from being deposited onto the metal layer, by a deposition step that includes a continuous flow of gaseous organometallic precursor, a continuous flow of co-reactant, and a pulsed (non-continuous) flow of oxidizer. See FIG. 2 and Example 1, showing a CVD method. The combination of the continuous flow of organometallic precursor and reducing gas, with pulsed flow of oxidizer, can be used to deposit a desired amount of metal layer onto a substrate, e.g., based on thickness, with oxidizer being introduced intermittently during deposition of the metal layer. The deposition method includes a period of continuous flow of the precursor and co-reactant, co-flowed with multiple pulse cycles of the oxidizer, each cycle of the oxidizer including an on-flow period and an off-flow period. The total number of pulse cycles, and the length of each cycle and the on-flow and off-flow periods thereof, can be selected to achieve a desired effect of removing carbon from the metal layer, or preventing carbon from being deposited within the metal layer, to provide a deposited metal layer that contains a reduced amount of carbon contamination as compared with a comparable method that does not include the presence of the oxidizer (e.g., a method of FIG. 2, without the presence of oxidizer).

According to other examples of the present method, a metal layer is deposited onto a substrate by a deposition method that includes pulsed flows of the organometallic precursor and reducing gas, a pulsed flow of oxidizer, and pulsed flow of purge gas. See Example 2, showing an ALD method. A first on-flow provides the precursor supplied in an inert carrier gas, with no other flow into the deposition chamber (i.e., "alone"). An immediately-following on-flow is of an inert purge gas with no other flow. A next-subsequent on-flow is of the oxidizer in combination with $H_2$ flow; the oxidizer is effective to remove carbon from the film surface of the growing deposited metal layer and the reducing $H_2$ gas can reduce other contaminants present at the surface, such as oxygen. After the oxidizer and reducing gas is a second pulsed flow of the inert purge gas. Following the second on-flow of purge gas, the series is repeated starting with the flow of precursor in carrier gas. By this method, none of these flows is continuous and all of the described flows are pulsed. The overall deposition method includes a period of metal-layer deposition, followed by a purge, followed by a period of oxidizer flow to remove carbon from the deposited metal layer surface and reducing gas flow to reduce contaminants, followed by a second purge, after which the series is repeated. The total number of repetitions of the series produces a metal layer that has a desired thickness, and that includes a reduced amount of carbon compared to a metal layer produced by a comparable method that does not include the flow of oxidizer.

Yet another example of a vapor deposition method includes a series of pulsed flows that includes a pulsed flow of organometallic precursor (alone), a pulsed flow of inert purge gas, a pulsed flow of oxidizer (e.g., water and hydrogen), an optional pulsed flow of gaseous hydrogen, and a second pulsed flow of inert purge gas. See example 3, showing an ALD method. A first on-flow provides the precursor, optionally supplied in an inert carrier gas, alone (with no other flow into the deposition chamber during the on-flow). An immediately-following on-flow is of an inert purge gas with no other flow (i.e., alone). A next-subsequent on-flow is of the oxidizer (e.g., water vapor and gaseous hydrogen), with no other flow; the oxidizer is effective to remove carbon from a surface of the deposited metal layer. Following the oxidizer step, a pulse of reducing gas may optionally be flowed into the deposition chamber with no other flows; the reducing gas can reduce other contaminants present at the surface, such as oxygen. After the oxidizer on-flow or optional reducing gas on-flow is a second pulsed flow of the inert purge gas. Following the second on-flow of purge gas the series is repeated starting with the flow of precursor. By this method, none of these flows is continuous, and each identified gaseous composition (including the combination or water and oxygen) may be flowed to the deposition chamber alone. The overall deposition method includes a process for metal-layer deposition, followed by a purge, followed by a period of oxidizer flow to remove carbon from the deposited metal layer surface, optionally followed by a reducing gas to reduce other contaminants (e.g., oxygen), followed by a second purge, after which the series is repeated. The total number of repetitions of the series produces a metal layer that has a desired thickness and that includes a reduced amount of carbon compared to a metal layer produced by a comparable method that does not include the flow of oxidizer.

A method as described can be performed in a deposition chamber that contains as an atmosphere, during use, substantially only the gaseous precursor, optional carrier gas, co-reactant gas, optional inert purge gas, and oxidizer, e.g., the deposition chamber atmosphere may comprise, consist of, or consist essentially of: the gaseous precursor, optional carrier gas, optional purge gas, co-reactant gas, and oxidizer. For purposes of the present disclosure, a deposition chamber or related gas flow or combination of gas flows that consists essentially of a specified combination of gaseous materials is considered to contain the specified combination of gaseous materials and not more than an insubstantial amount of any other gaseous material, e.g., not more than 2, 1, 0.5, 0.1, 0.05, 0.01, or 0.005 percent (by mass) of any other gaseous material.

The amount of gaseous precursor (a.k.a., precursor vapor), the amount of co-reactant gas, the amount of optional purge gas, and the amount of oxidizer supplied to a deposition chamber can be an amount of each that will be useful to produce a desired effect of each gaseous fluid, to produce as a result of the method a metal layer of molybdenum or tungsten and a desirably low amount of carbon. The amounts of the respective gases supplied to a deposition chamber, in terms of their respective flowrates, can be based on factors that include other processing parameters, the desired amount (e.g., thickness) of a deposited metal layer, the desired deposition rate, the size (volume) of the deposition chamber, and the interior pressure of the deposition chamber. Also, the example amounts and ranges of each gaseous fluid described as being useful to supply to a deposition chamber can be consistent relative to one another, but larger or smaller based on a similar mathematical factor that is determined by the size of a deposition chamber used.

According to non-limiting examples of certain methods that have been identified as being useful, a precursor-carrier gas mixture may contain in a range from 0.01 to 5% precursor in inert gas (e.g., Ar, $H_2$ or a combination of these), and can be flowed to the deposition chamber at a rate useful for coating a 300 mm wafer, as expected for full-scale semiconductor manufacturing. Example flow rates of the precursor-carrier gas mixture can be in a range from 25 to 5,000 standard cubic centimeters per minute (25-5,000 sccm) for a chamber supporting a 300 mm wafer operating at an interior pressure in a range from 0.1 to 500 Torr. On a basis of a flow rate per chamber volume, example flow rates may be in a range from 10 to 400 sccm per cubic inch of deposition chamber volume, such as from 1 to 100 sccm per cubic inch of deposition chamber volume. On a basis of an amount of precursor that flows to the deposition chamber, example flows may be in a range from 0.1 to 100 micromoles per minute, e.g., from 1 to 50 or from 2 to 20 micromoles precursor per minute.

According to non-limiting examples of certain methods that have been identified as being useful, a flow rate of co-reactant gas, e.g., hydrogen, which may be continuous during a pulse cycle, can be in a range from 10 or 20 to 1000 sccm, this rate being useful for a deposition chamber supporting a single 300 mm wafer and operating at an interior pressure in a range from 0.1 to 500 Torr; a larger chamber would require a correspondingly larger amount (rate) of flow.

An internal pressure of the deposition chamber can be one that is effective for deposition of a metal layer as described. Typically, a deposition chamber used for chemical vapor deposition operates at a pressure that is not greater than approximately ambient pressure, typically understood to be approximately 760 Torr. Often, a deposition chamber will operate with a pressure that is substantially below atmospheric pressure, such as at an interior pressure that is in a range from 0.1 to 300, 400, or 500 Torr, e.g., in a range from 1, 5, or 10 Torr to 100 Torr.

A substrate, during deposition, can be held at any temperature that is effective for depositing molybdenum or tungsten onto the substrate according to the present description. The use of an organometallic precursor for the tungsten or molybdenum is understood to allow for a substrate temperature during deposition that is low relative to a substrate temperature that is required to deposit tungsten or molybdenum onto a substrate using other halogenated precursors, such as a fluorinated, chlorinated, brominated, iodinated precursor, and oxy-halogenated precursors. For a method of the present description, a substrate may be held at an elevated temperature that does not exceed 400° C., e.g., the temperature may be in a range from 100° C. to 350° C., or in the range of from 150° C. to 300° C., during a deposition step.

Methods as described can be performed by deposition steps that include processing parameters, including those described herein, alone or in combination, that will result in one or desirably a combination of various desired physical properties of a processed substrate. Desired physical properties include one or more of a desired level of uniformity of a metal layer over a horizontal surface or non-planar surfaces of the substrate, or to produce an interconnect, a contact, an electrode, or the like; a desired level of conformality of a metal layer on a three-dimensional processed substrate; a desired composition of the deposited metal layer, such as a low level of impurities (e.g., carbon or other non-metal materials); a low electrical resistivity of the deposited metal layer; or a combination of these properties.

A vapor deposition step may be performed in any suitable manner as variously described herein, preferably using process parameters that include a pulsed flow of oxidizer in combination with values of other process parameters (including optional pulsed flow of other gaseous fluids) that will result in a layer of deposited molybdenum or tungsten that exhibits desired physical properties such as high purity and low resistivity. The molybdenum or tungsten may be deposited onto any desired substrate surface, such as a surface of a semiconductor or microelectronic device substrate, and may be adapted to perform any useful function as part of a device, or to facilitate processing of a device. Examples of functions of deposited molybdenum or tungsten include: as a conductive layer (e.g., as a via, channel, or contact) of a microelectronic logic or memory device. The deposited molybdenum may have a thickness that is effective to perform a desired function, and can be continuous.

The substrate and surface upon which the molybdenum or tungsten is deposited may include any two-dimensional or three-dimensional structure, with particular examples of microelectronic device substrates being a memory device such as a DRAM device or a 3D NAND device, or a "logic" device. A logic device may be a microelectronic device that includes a microprocessor. Examples include programmable logic devices (PLD) having configurable logic and flip-flops linked together with a programmable interconnect. This or another logic device may provide a microprocessor or other electronic function such as device-to-device interfacing, data communication, signal processing, data display, timing and control operations, among others. Other specific examples include those referred to as programmable logic arrays (PLAs); programmable Array Logic (PAL) (e.g., a logic device with fixed OR array and a programmable AND array; and sequential programmable logic devices (including flip-flops and AND-OR array within the IC chip).

The specific chemical composition of a surface of a memory or logic-type substrate onto which a metal layer as described will be deposited can be any chemical composition that will be useful for the device, to provide a layer of deposited molybdenum or tungsten. Generally, the metal layer may be deposited onto a dielectric layer or a nucleation layer. Non-limiting examples of materials of substrate surfaces onto which molybdenum or tungsten may be deposited include: silicon, silicon dioxide, silicon nitride, other silicon-based materials, titanium nitride (TiN), molybdenum (metal), molybdenum carbide (MoC), boron (B), tungsten (W), and tungsten carbon nitride (WCN).

Advantageously, a relatively lower deposition temperature that may be used to deposit tungsten or molybdenum using an organometallic precursor (e.g., a carbonyl-type precursor or an amide-imide precursor, an aryl or substituted aryl precursor), in combination with oxidizer to remove carbon from the deposited film or the metal layer, allows for a deposition temperature that will not degrade temperature sensitive features of a logic device, yet also provides a metal layer with a reduced level of carbon contaminant relative to other precursors or methods.

Example vapor deposition series according to the invention include the following:

Example 1 (Pulsed CVD)

At low temperature and other conditions that cause $Mo_2C$ to be deposited, but with good step coverage, using continuous CVD with pulsed oxygen. See FIG. 2 and tables 1 through 4.

Series:

$(EtBz)_2Mo+H_2$(time limits thickness<50 Å)/ $(EtBz)_2Mo+O_2$:$H_2$<50%

Example 2 (ALD)

Series:

$(EtBz)_2Mo$+inert/inert purge/$(O_2/H_2)$/inert purge

Temperature and pressure are controlled to result in self-limiting deposition with respect to precursor dose time.

The oxygen ($O_2$) dose is limited to surface oxidation of the Mo.

The hydrogen ($H_2$) dose is sufficient to remove substantially all oxygen from the surface.

Example 3 (ALD)

Series:

Mo imide-amide/inert purge/$(H_2O+H_2)$/optional $H_2$/inert purge

Temperature and pressure are controlled to result in self-limiting deposition with respect to precursor dose time.

Results of Example 1

Tables 1 through 4 contain data of evaluations of various processing conditions and parameters of methods of the invention performed using a pulsed CVD method described generally as Example 1. In the tables, the thickness of a deposited film (e.g., XRF Mo) or the carbon content of a deposited film (XRF C) was measured by x-ray fluorescence (XRF).

Figure 2:
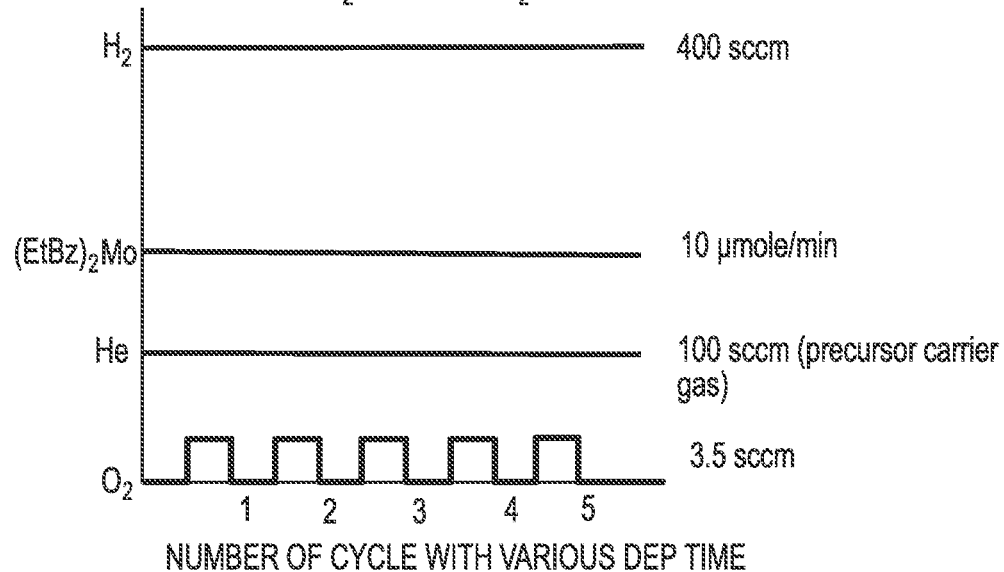
FIG. 2 illustrates an example of input flows for a vapor deposition method as described, using a pulsed flow of oxidizer.

Tables 1 through 4 show that methods performed according to the general procedure of Example 1 and FIG. 2, using a pulsed flow of oxidizer during formation of a metal layer, can result in a reduced concentration of carbon in the metal layer.

Effects of $O_2$ on Carbon Content

TABLE 1

$O_2$ addition reduces carbon content of MoC film
200° C., 30 Torr, 10 μmole/min, 400 sccm $H_2$, 3.5 sccm $O_2$

| Substrate | XRF Mo (Å) | Co-reactant | XRF C (μg/cm$^2$/10 mm Mo) |
|---|---|---|---|
| TaN | 290.9 | 20 min $H_2$ | 1.28 |
| TaN | 200.1 | (5 min $H_2$/5 min $O_2/H_2$) X 4 | 0.61 |
| TaN | 35.5 | (2 min $H_2$/2 min $O_2/H_2$)X 5 | <0.3 |
| $SiO_2$ | 183.8 | 20 min $H_2$ | 0.82 |
| $SiO_2$ | 110.4 | (3 min $H_2$/5 min $O_2/H_2$) X 4 | 0.34 |
| $SiO_2$ | 15.6 | (2 min $H_2$/2 min $O_2/H_2$) X 5 | <0.3 |
| WN | 325.8 | 20 min $H_2$ | 1.24 |
| WN | 252.4 | (5 min $H_2$/5 min $O_2/H_2$) X 4 | 0.67 |
| WN | 64.4 | (2 min $H_2$/2 min $(O_2/H_2)$ X 10 | 0.34 |

Effects of $O_2$ Pulsing on Carbon Content

TABLE 2

$O_2$ addition reduces carbon content
200° C., 20 Torr, 10 μmole/min, 400 sccm $H_2$, 3.5 sccm $O_2$ pulse

| Substrate | XRF Mo (Å) | Co-reactant | XRF C (μg/cm$^2$/10 nm Mo) |
|---|---|---|---|
| TaN | 82.7 | 25 min $H_2$ | 2.26 |
| TaN | 310.1 | (5 min $H_2$/5 min $O_2/H_2$) X 6 | 1.04 |
| TiN | 116.3 | 25 min $H_2$ | 1.84 |
| TiN | 263.9 | (5 min $H_2$/5 min $O_2/H_2$) X 6 | 0.95 |
| WN | 119.4 | 25 min $H_2$ | 2.05 |
| WN | 334.9 | (5 min $H_2$/5 min $O_2/H_2$) X 6 | 1.03 |

Effects of $O_2$ Co-Reactant on Mo Deposition

TABLE 3

$O_2$ addition reduces carbon content
200° C., 15 Torr, 10 μmole/min, 400 sccm $H_2$, 3.5 sccm $O_2$ pulse

| Substrate | XRF Mo (Å) | Co-reactant | XRF C (μg/cm$^2$/10 nm Mo) |
|---|---|---|---|
| TaN | 54.9 | 25 min $H_2$ | 2.37 |
| TaN | 207.8 | (5 min $H_2$/5 min $O_2/H_2$) X 5 | 1.28 |
| TiN | 87.5 | 25 min $H_2$ | 1.74 |
| TiN | 188.8 | (5 min $H_2$/5 min $O_2/H_2$) X 5 | 1.09 |
| WN | 96.7 | 25 min $H_2$ | 2.12 |
| WN | 221.9 | (5 min $H_2$/5 min $O_2/H_2$) X 5 | 1.26 |

Effects of $O_2$ Co-Reactant on Mo Deposition

TABLE 4

$O_2$ addition reduces carbon content of deposited MoC film
175° C., 30 Torr, 10 μmole/min, 400 sccm $H_2$, 3.5 sccm $O_2$ pulse

| Substrate | XRF Mo (Å) | Co-reactant | C/Mo (μg/cm$^2$/10 nm Mo) |
|---|---|---|---|
| TaN | 94.1 | 45 min $H_2$ | 2.01 |
| TaN | 132.6 | (5 min $H_2$/5 min $O_2/H_2$) X 5 | 0.96 |
| TiN | 133.2 | 45 min $H_2$ | 1.85 |
| TiN | 90.9 | (5 min $H_2$/5 min $O_2/H_2$) X 5 | 0.61 |
| WN | 128.8 | 45 min $H_2$ | 1.88 |

TABLE 4-continued

O$_2$ addition reduces carbon content of deposited MoC film
175° C., 30 Torr, 10 µmole/min, 400 sccm H$_2$, 3.5 sccm O$_2$ pulse

| Substrate | XRF Mo (Å) | Co-reactant | C/Mo (µg/cm$^2$/10 nm Mo) |
|---|---|---|---|
| WN | 131.7 | (5 min H$_2$/5 min O$_2$/H$_2$) X 5 | 0.92 |
| SiO$_2$ | 84.8 | 45 min H$_2$ | 1.31 |
| SiO$_2$ | 77.5 | (5 min H$_2$/5 min O$_2$/H$_2$) X 5 | 0.35 |

What is claimed is:

1. A deposition method for forming a metal film on a substrate, wherein the method is a pulsed chemical vapor deposition method comprising:
    continuously flowing a gaseous precursor produced from an organometallic precursor and a reducing gas co-reactant into a deposition chamber,
    exposing the substrate to the gaseous precursor and the reducing gas co-reactant, to form a deposited metal layer thereon, the organometallic precursor comprising a metal and one or more carbon-containing ligands, wherein the metal is molybdenum or tungsten,
    flowing an oxidizer into the deposition chamber by a pulsed flow, and
    exposing the deposited metal layer to the oxidizer, forming the metal film.

2. The method of claim 1 wherein the method forms a metal film having a thickness that does not exceed 50 angstroms.

3. The method of claim 1 further comprising, after exposing the deposited metal and the carbon to the oxidizer, flowing hydrogen gas into the deposition chamber.

* * * * *